United States Patent
Minotti et al.

(10) Patent No.: US 12,094,806 B2
(45) Date of Patent: Sep. 17, 2024

(54) BLOCKING ELEMENT FOR CONNECTING PINS OF SEMICONDUCTOR DICE

(71) Applicant: STMicroelectronics S.r.l., Agrate Brianza (IT)

(72) Inventors: Agatino Minotti, Mascalucia (IT); Francesco Salamone, Acireale (IT); Massimiliano Fiorito, S Agata Li Battiati (IT); Alessio Scordia, Catania (IT); Manuel Ponturo, Aci Sant'Antonio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 113 days.

(21) Appl. No.: 17/491,082

(22) Filed: Sep. 30, 2021

(65) Prior Publication Data

US 2022/0108939 A1   Apr. 7, 2022

(30) Foreign Application Priority Data

Oct. 7, 2020   (IT) .......................... 102020000023641

(51) Int. Cl.
| | |
|---|---|
| H01L 23/49 | (2006.01) |
| H01L 23/373 | (2006.01) |
| H01L 23/492 | (2006.01) |
| H01R 12/58 | (2011.01) |
| H01R 43/02 | (2006.01) |

(52) U.S. Cl.
CPC .......... H01L 23/49 (2013.01); H01L 23/3735 (2013.01); H01L 23/492 (2013.01); H01R 12/585 (2013.01); H01R 43/0207 (2013.01)

(58) Field of Classification Search
CPC ........................................................ H01L 23/49
USPC .......................................................... 257/693
See application file for complete search history.

(56) References Cited

U.S. PATENT DOCUMENTS

| | | | |
|---|---|---|---|
| 2009/0194884 A1 | 8/2009 | Stolze | |
| 2013/0175704 A1* | 7/2013 | Jeun | H01L 23/49562 257/E23.116 |
| 2014/0167237 A1* | 6/2014 | Yoo | H01L 24/73 257/676 |
| 2016/0380366 A1 | 12/2016 | Onishi et al. | |
| 2019/0189529 A1 | 6/2019 | Nishida et al. | |

FOREIGN PATENT DOCUMENTS

| | | | | |
|---|---|---|---|---|
| DE | 102014211698 A1 * | 12/2015 | ............. | H01L 23/48 |
| DE | 102020105267 A1 * | 1/2021 | ......... | H01L 21/4853 |
| JP | 2015179646 A | 10/2015 | | |

\* cited by examiner

*Primary Examiner* — Ajay Arora
(74) *Attorney, Agent, or Firm* — Seed IP Law Group LLP

(57) ABSTRACT

A blocking element is provided for connecting an electronic, micro-mechanical and/or micro-electro-mechanical component, in particular for controlling the propulsion of an electric vehicle. The pin blocking element is formed by a holed body having a first end, a second end and an axial cavity configured for fittingly accommodating a connecting pin. A first flange projects transversely from the holed body at the first end and a second flange projects transversely from the holed body at the second end. The first flange has a greater area than the second flange and is configured to be ultrasonically soldered to a conductive bearing plate to form a power module.

18 Claims, 4 Drawing Sheets

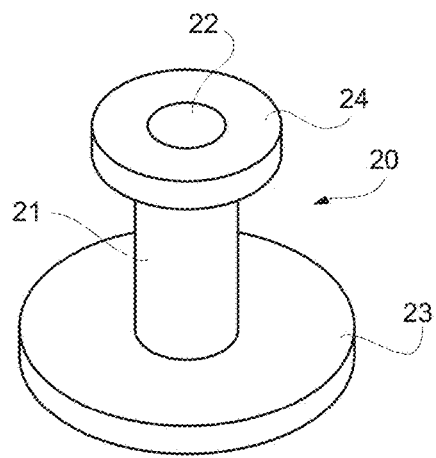
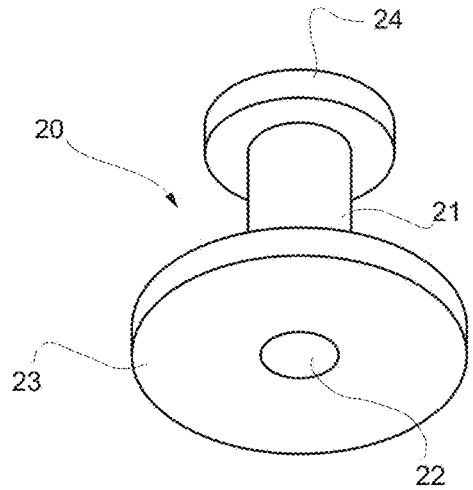
FIG. 7  FIG. 8
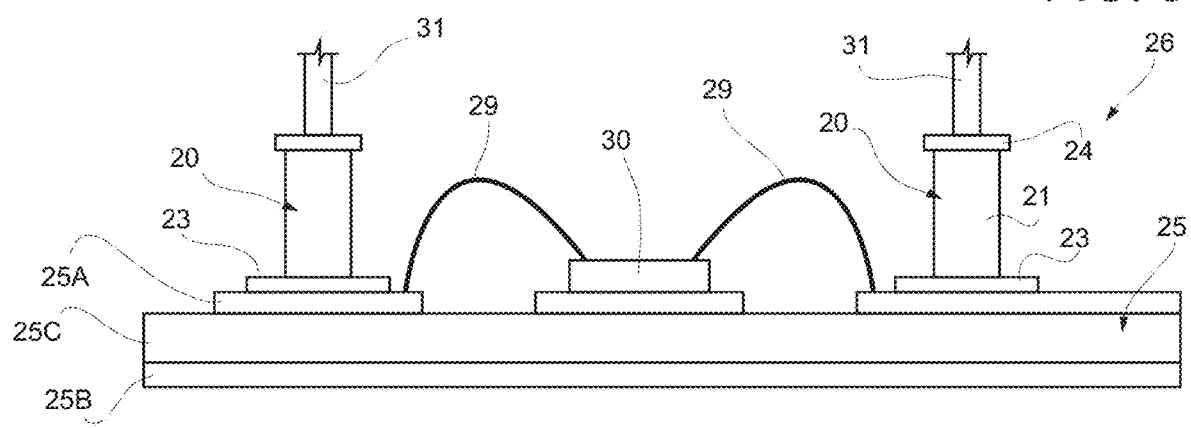
FIG. 9
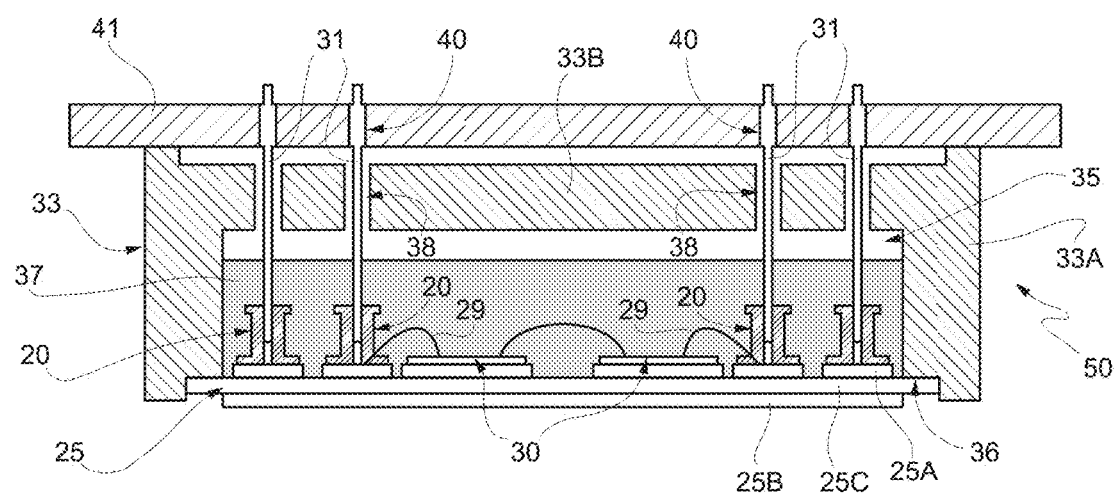
FIG. 10

BLOCKING ELEMENT FOR CONNECTING PINS OF SEMICONDUCTOR DICE

BACKGROUND

Technical Field

The present disclosure relates to a blocking element for connecting pins of semiconductor dice, in particular for power modules for automotive applications, and to an assembling method. More particularly, the disclosure is applicable to electric propulsion vehicles.

Description of the Related Art

Electric propulsion vehicles comprise control electronics of an electric motor. In particular, the control electronics associated with vehicles of this type comprises power modules and signal processing modules; furthermore, there are special connection structures, which typically utilize connecting pins of larger dimensions with respect to the electronic circuits used in other fields.

BRIEF SUMMARY

According to the present disclosure, a blocking element for connecting pins of semiconductor dice, a mounted plate for connection of electronic components, a power module and an assembling method are provided.

In at least one embodiment, a pin blocking element is provided that includes a holed body having a first end, a second end and an axial cavity configured for fittingly accommodating a connecting pin. A first flange projects transversely from the holed body at the first end, and a second flange projects transversely from the holed body at the second end. The first flange has a larger area than the second flange and is configured to be ultrasonically soldered to a conductive bearing plate.

BRIEF DESCRIPTION OF THE SEVERAL VIEWS OF THE DRAWINGS

For a better understanding of the present disclosure, an embodiment thereof is now described, purely by way of non-limiting example, with reference to the attached drawings, wherein:

FIG. 7 is a perspective top view of the present pin holder;

FIG. 8 is a perspective bottom view of the present pin holder;

FIG. 9 is a cross-section of a portion of a mounted plate to be assembled in a power module and including the pin holder of FIGS. 7 and 8;

FIG. 10 is a cross-section through a power module including the mounted plate of FIG. 9.

DETAILED DESCRIPTION

Figure 1:
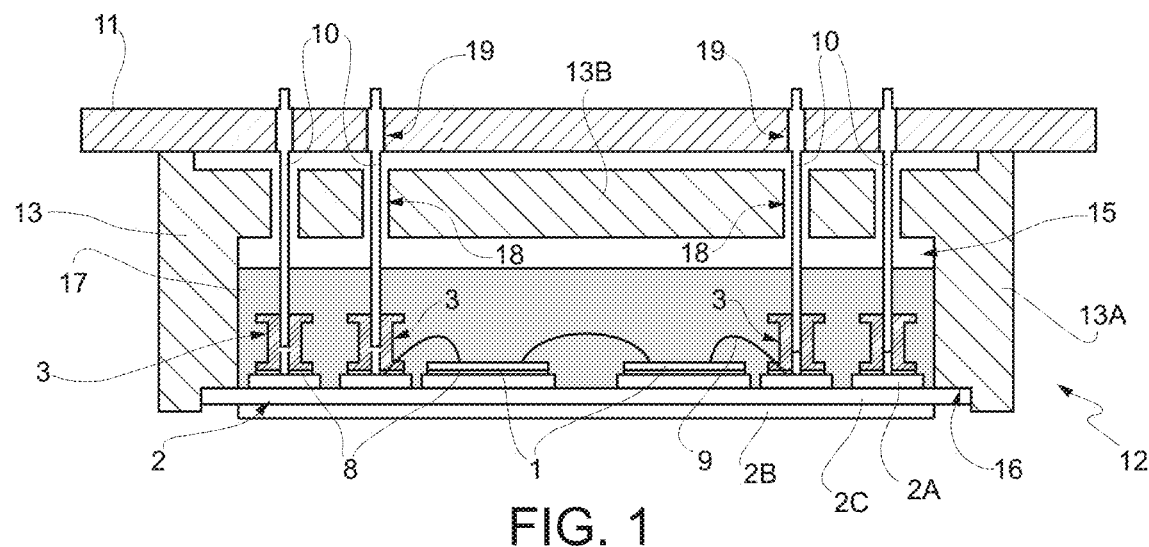
FIG. 1 is a cross-section through a power module usable for automotive applications.

FIG. 1 shows a power module 12, wherein the electrical components (including any micro-electro-mechanical components) are connected to a printed circuit board through a solderless pressfit technique, according to a comparative example.

In the embodiment shown in FIG. 1, two dice, indicated with 1, are attached to a dissipating plate 2. The dice 1 may integrate electrical and/or electromechanical structures and have power and/or control functions, separately from each other or integrated in a same die.

Here, the dissipating plate 2 is formed by a DBC (Direct Bonded Copper) multilayer formed by a first and a second metal layer 2A, 2B and by an intermediate insulating layer 2C, for example of ceramic. At least one of the metal layers (here the first metal layer 2A) is shaped, so as to define reciprocally insulated conductive regions. Each die 1 is attached to a respective conductive region of the first metal layer 2A.

Figure 3:
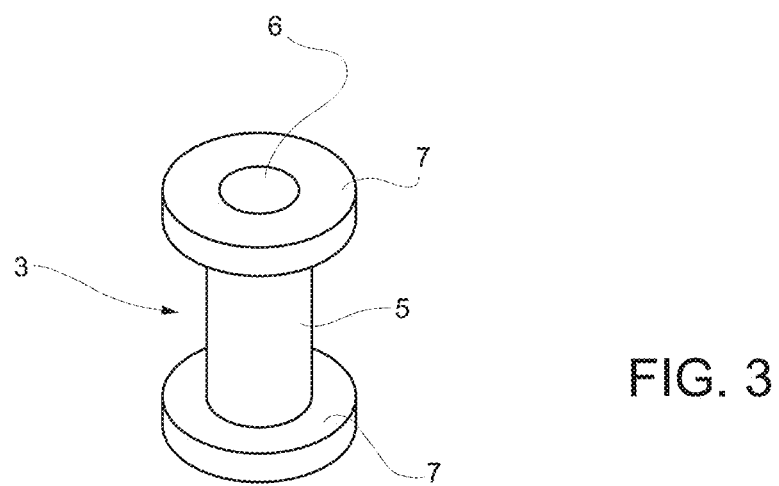
FIG. 3 is a perspective view of a pin holder of the power module of FIG. 1.
Figure 4:
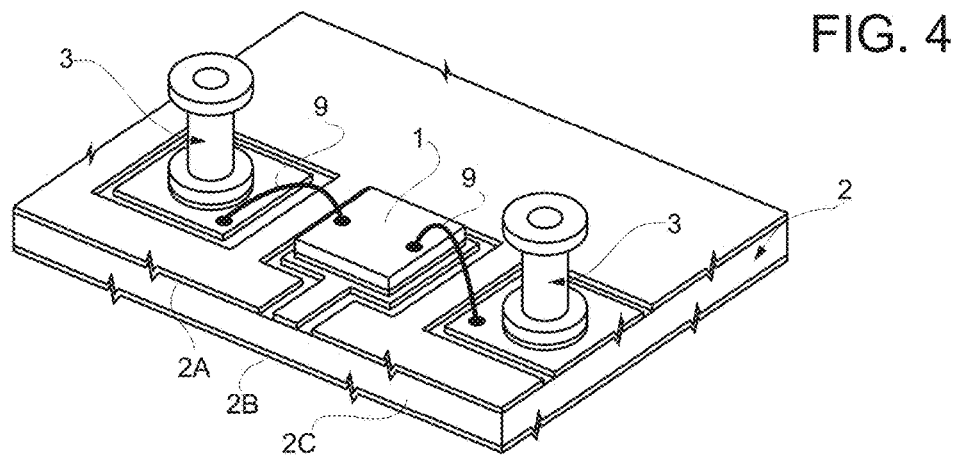
FIG. 4 is a perspective view of a portion of the power module of FIG. 1 in an assembling step.
Figure 5:
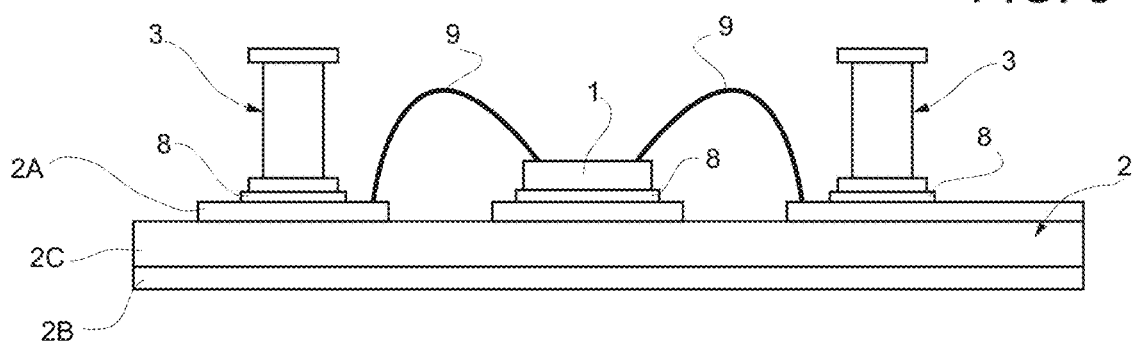
FIG. 5 is a cross-section through the detail of FIG. 4.
Figure 6:
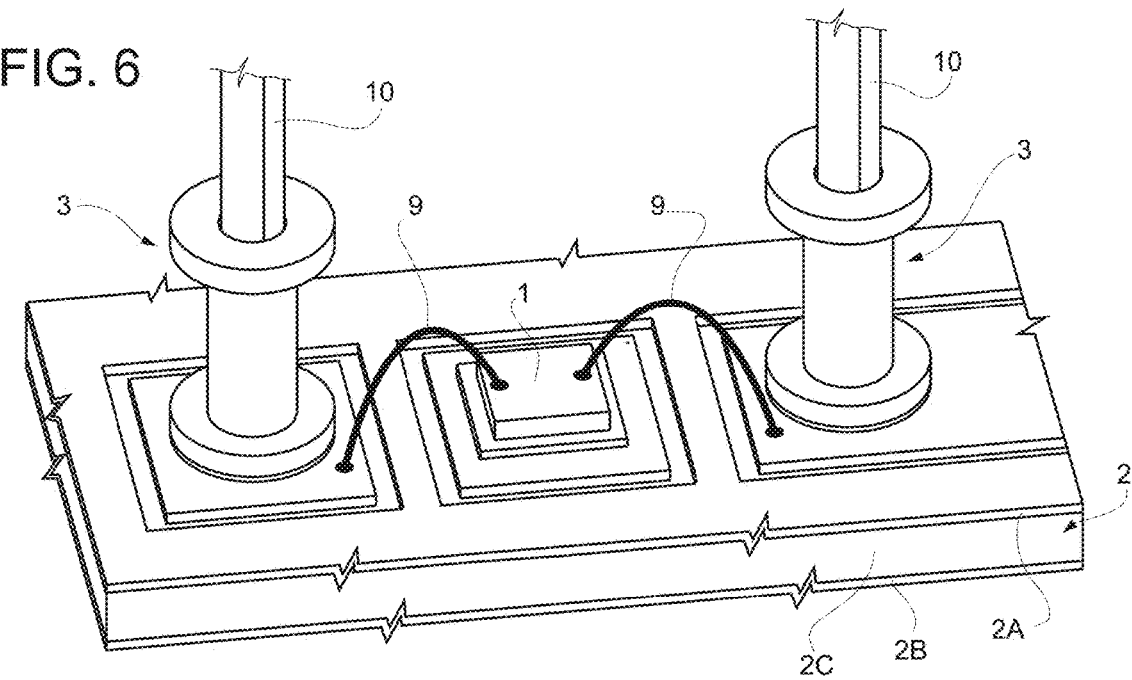
FIG. 6 is a perspective view of another portion of the power module of FIG. 1 in an assembling step successive to FIG. 4.

As also shown in FIGS. 4-6, pin holders 3 are attached to respective conductive regions of the first metal layer 2A of the dissipating plate 2. Each pin holder 3 (FIG. 3) is formed by a tubular body 5, here of cylindrical shape, having an axial cavity 6 and provided with a pair of flanges 7 on its bases.

With reference again to FIGS. 1, 4-6, the pin holders 3 are attached to the dissipating plate 2 through respective soldering regions 8.

In particular, each soldering region 8 is arranged between one of the flanges 4 of the respective pin holder 3 and the dissipating plate 2. Soldering regions 8 are also arranged between the dice 1 and the respective conductive regions of the first metal layer 2A.

Wires 9 are selectively soldered between pads (not visible) of the dice 1 and selective conductive regions of the first metal layer 2A to electrically connect the dice 1 to each other and to the outside, according to a desired electric diagram.

In particular, the connection to the outside is obtained through pins 10 fastened to the pin holders 3.

Figure 2:
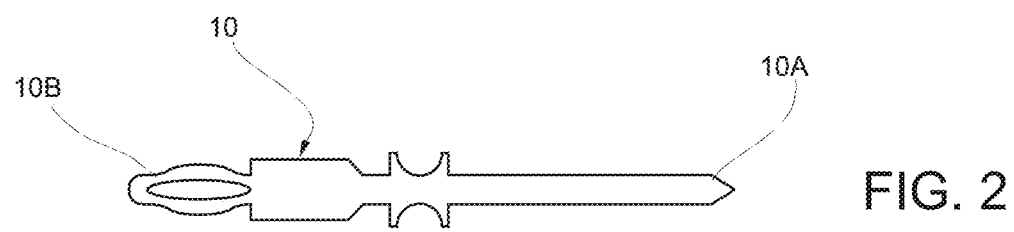
FIG. 2 is top plan view of a pin of the power module of FIG. 1.

The pins 10 have an elongated shape and may be shaped as shown in FIG. 2. In particular, here, the pins 10 are rod-shaped elements, of a length comprised between 13 and 15 mm and a square section (for example with a side of 0.64 mm). Furthermore, they may be provided with enlarged stop zones for blocking with respect to a connection support 11, described in detail hereinbelow.

The pins 10 have a first end 10A and a second end 10B.

The first end 10A of the pins 10 is preferably pointed and is force fitted into the axial cavity 6 of the respective pin holder 3 to obtain a press-fit.

The second end 10B of the pins 10 is here transversely holed (as a keyhole, see in particular FIG. 2). The second end 10B of the pins 10 is thus elastically flexible in transversal direction with respect to its length, thus allowing the pins 10 to be fixed to the connection support 11, as described hereinbelow.

The dissipating plate 2 is fixed to a housing 13, for example of plastic. The housing 13 is formed by a side wall 13A and by a bottom wall 13B. The side wall 13A surrounds a chamber 15 and, on its edge opposite to the bottom wall 13B, has an inner peripheral notch 16 where the dissipating plate 2 is attached. In particular, the dissipating plate 2 is arranged so that the dice 1 and the pin holders 3 face the inside of the chamber 15 of the housing 13; in practice the dissipating plate 2 closes the chamber 15 on one side.

A potting compound 17 may be provided inside the chamber for insulating and protecting the dice 1 and the electrical connections.

The bottom wall 13B of the housing 13 has a plurality of holes 18, through which the pins 10 extend.

The connection support 11 is fixed to the housing 13 externally, to the bottom wall 13B thereof. The connection support 11 is made, for example, by a printed circuit board PCB and has, in turn, a plurality of through openings 19 aligned with the holes 18.

The through openings 19 have conductive walls, for example have a surface metal coating (not shown), and are sized in such a way that the second end 10B of the pins 10 may be forced fitted and remain blocked into the through openings 19, due to its elasticity, with a press-fit coupling.

In this manner, a good mechanical retention of the pins and a good electrical connection between the connection support 11 and the dice 1 are obtained without the need for soldering at the level of the connection support 11, as often desired for automotive applications.

The power module 12 described above is assembled by securing the dice 1 and the pin holders 3 to the dissipating plate 2; then inserting the pins 10 into the pin holders 3; fixing the dissipating plate 2 to the housing 13, after introducing the potting compound 17, and press-fitting the second ends 10B of the pins 10 into the connection support 11.

In particular, fixing of the pin holders 3 is performed by soldering. To this end, a solder cream or paste is spread on the dissipating plate 2; the pin holders 3 are suitably placed by a manipulating machine; then a warm reflow process, followed by a wet washing step, is performed.

The solder cream used to temporarily hold the pin holders 3 in place is generally formed by an emulsion of a flux and soldering alloy beads which has an adhesive effect. During the reflow step, most of the flux is removed and the soldering alloy beads melt, soldering the pin holders 3 to the dissipating plate 2.

Therefore, in this step, before the soldering alloy beads are completely melted, the pin holders 3 are weakly held in place. Thus, it may occur that they move with respect to the desired position and, at the end of the process, are attached in the wrong position, displaced with respect to the desired one by a space of almost one millimeter. As a result, the respective pins 10 are also misplaced, creating problems to the final manufacturer for their fitting into the through openings 19.

Furthermore, the soldering process is expensive, since it relies on two separate operations utilizing a considerable amount of time and power to perform. Furthermore, in case further structures are provided to hold the pin holders 3 in place (in general metal fixtures), there is an increase in the quantity of metal. It means that, in case of furnace reflow, more heating energy is utilized, which leads to longer working time, more energy utilized, higher material costs and thus additional costs.

The reflow process may also lead to the generation of thermomechanical stresses detrimental to the electronic components.

In various embodiments, the present disclosure provides a solution to the problems of comparative example.

FIGS. 7 and 8 show a pin holder 20 usable in a power module 50 shown in FIG. 10 and similar to the power module of FIG. 1.

With reference to FIGS. 7, 8, the pin holder 20 is formed by a tubular body 21, in particular cylindrical, having an axial cavity 22, a first flange 23 at a first base and a second flange 24 at a second base.

In particular, the first flange 22 has a greater diameter with respect to the second flange 24.

For example, for a pin holder 20 having a height comprised between 3 and 7 mm, in particular of 3.5-5 mm, the first flange 23 may have an outer diameter comprised between 2.5 and 4 mm, in particular of 3-3.5 mm; and the second flange 24 may have an outer diameter comprised between 1.25 and 2.5 mm, in particular of 1.5-1.75 mm.

The pin holder 20 is also, for example, of copper or bronze.

The pin holder 20 of FIGS. 7 and 8 is fixed through High Power Ultrasonic Welding, HPUS, to a bearing plate 25, as shown in FIGS. 9 and 10.

FIG. 9 shows a mounted plate 26 formed by a bearing plate 25 to which the pin holders 20 are fixed.

The bearing plate 25 also bears dice 30, integrating electrical and/or electro-mechanical structures; in particular, the dice 30 may have power and/or control functions, integrated separately from each other or in a same die. The dice 30 and the pin holders 20 are attached, here each in a respective conductive region of the first metal layer 2A, through an ultrasonic technique, without using reflow processes, as described hereinbelow.

The bearing plate 25 is formed by a DBC (Direct Bonded Copper) multilayer formed by a first and a second metal layer 25A, 25B and by an intermediate insulating layer 25C, for example of ceramic. At least one of the metal layers (here the first metal layer 25A), is shaped, so as to define conductive regions insulated from each other.

Wires 29 are selectively soldered between pads (not visible) of the dice 30 and respective regions of the first metal layer 25A.

In the mounted plate 26 of FIG. 9, pins 31 have already been attached to the pin holders 20. The pins 31 may be exactly like the pins 10 of FIG. 2; in particular they have an elongated shape having a first end 31A intended to be press-fitted into the axial cavity 22 of a respective pin holder 20 and a second end 31B that is deformable, intended to be press-fitted into a connection support 41 (see FIG. 10).

The mounted plate 26 may be attached to the power module 50 of FIG. 10, comprising (similarly to the power module of FIG. 1) a housing 33 formed by a side wall 33A and by a bottom wall 33B. The side wall 33A surrounds a chamber 35 and, on its edge opposite to the bottom wall 33B, has an internal peripheral notch 36 to which the dissipating plate 25 is attached. The dissipating plate 25 is arranged so that the dice 30 and the pin holders 20 face the inside of the chamber 35 of the housing 33 and, in practice, closes the chamber 35 on one side.

A potting compound 37 may be provided inside the chamber for insulating and protecting the dice 30 and the electrical connections.

The bottom wall 33B of the housing 33 has a plurality of holes 38 in which the pins 31 extend. The pins 31 are also press-fitted, at a second end thereof, into through openings 40 of the connection support 41, formed for example as a printed circuit board PCB, similarly to what previously described with reference to FIG. 1.

As indicated above, the pin holders 20 and the dice 30 are soldered to the bearing plate 25 through Ultra Power Ultrasound Welding, HPUS.

Figure 11:
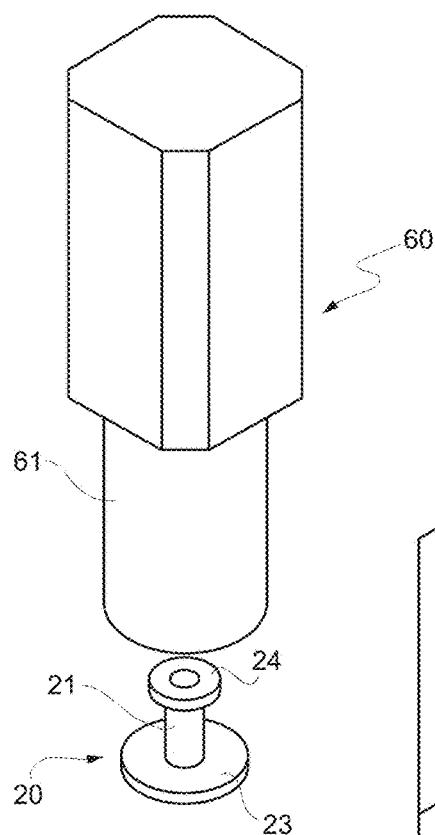
FIGS. 11-13 show a transducer usable for soldering the pin holder of FIGS. 7 and 8, respectively, in a perspective top view, in a perspective bottom view and while holding the present pin holder.
Figure 12:
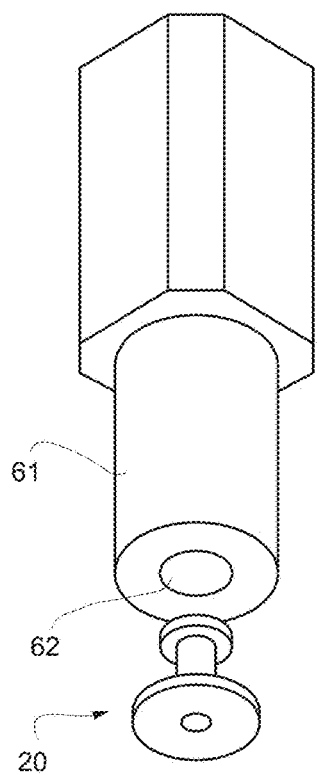
Figure 13:
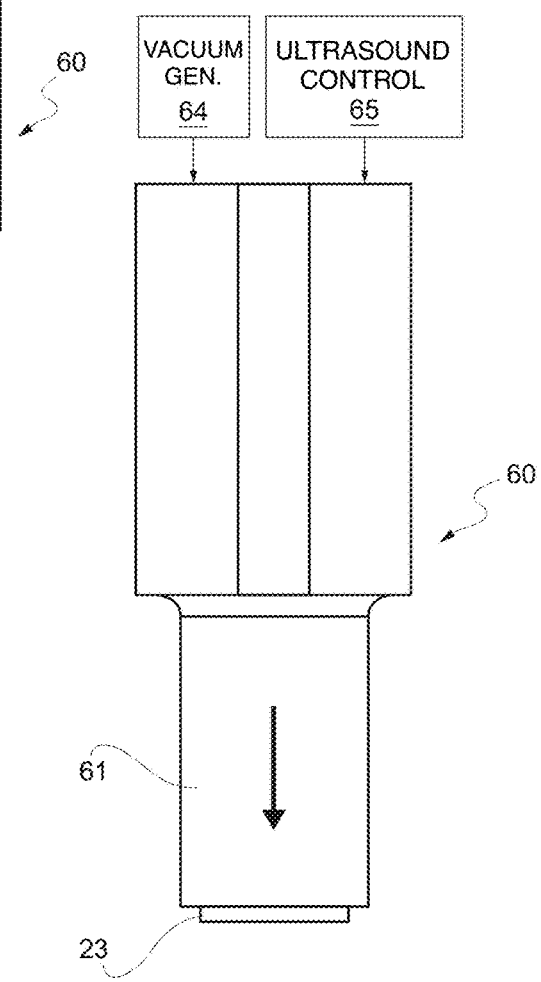

In particular, the pin holders 20 may be picked up and placed on the bearing plate 25 through a transducer 60 shown in FIGS. 11-13.

Specifically, the transducer 60 of FIGS. 11-13 has a gripping portion 61 that is hollow and has a gripping cavity 62 that is cylindrical and has a diameter comprised between the diameter of the first flange 23 and the diameter of the second flange 24 of the pin holders 20.

In an only schematically shown manner, the gripping portion 61 is coupled to vacuum generation means 64, capable of creating a depression inside the gripping cavity 62, and to solder ultrasonic energy generation means 65.

Then, during the assembling step, the vacuum generation means 64 is activated and the transducer 60 picks up a pin holder 20, sucking it so that the second flange 24 thereof (smaller) and the tubular body 21 are sucked inside the gripping cavity 62 and only the first flange 23 abuts against the base of the gripping element 41 of the transducer 60 (FIG. 13). Then the transducer 60 places the pin holder 20 in a desired manner on the bearing plate 25 and solders it through the HPUS technique, following deactivation of the vacuum generation means 64 and activation of the solder ultrasonic energy generation means 65 (for example at a frequency comprised between 20 and 50 kHz).

In practice, the transducer 60 presses the pin holder 20 against the bearing plate 25, applying ultrasonic energy (at high frequency).

For example, the transducer 60 may operate at room temperature, with a power lower than 1 kW, applying a force comprised between 10 and 200 N for 0.1-1 seconds.

The dice 30 may be soldered with the same technique. In particular, in this case, the depression created in the gripping cavity 62 allows a die 30 to be held against the base of the transducer 60 and to be suitably placed on the bearing plate 25, before soldering.

If the components have wire connections of the type shown in FIGS. 9 and 10, the wires 29 are soldered to the bearing plate 25 and to the dice 30 through known techniques, for connecting the dice 30 to each other and/or to the pin holders 20.

Then, the pins 30 may each be press-fitted into a respective pin holder 20 and the steps described above may be performed to complete assembling of the power module 50.

In this manner, a very stable, resistant and accurate soldering of the pin holders 20 (and of the dice 30) is obtained, with lower costs with respect to the solution of the comparative example.

In fact, due to the increased size of the first base 23 of the pin holders 20, they may be picked up, held and accurately placed on the bearing plate 25. In this manner, a solder accuracy of ±0.05 mm may be achieved, with a considerable improvement with respect to the current techniques.

As a result the pins 31 may also be placed in an accurate manner both in the pin holders 20 and in the connection support 41.

Furthermore, the large surface of the first base 23 provides a wide solder area, making it very stable even over time.

The high-pressure ultrasound soldering process further allows the reflow step and the successive washing step previously used to be eliminated, reducing assembling costs thanks to both the elimination of per se expensive steps and the reduction of the number of steps.

Since the soldering occurs at room temperature, thermal treatments may be eliminated, and thus any thermomechanical stress on the system may be reduced, increasing the production yield.

Finally, it is clear that modifications and variations may be made to the blocking element for connecting pins, to the mounted plate, to the power module and to the assembling process described and illustrated herein without thereby departing from the protective scope of the present disclosure, as defined in the attached claims.

For example, although in the figures the dice 30 are electrically connected through wires 29, they may be made by packaged components connected through a surface mounting technique.

A pin blocking element (20) for connecting an electronic, micro-mechanical and/or micro-electro-mechanical component, in particular for controlling the propulsion of an electric vehicle, may be summarized as including a holed body (21) having a first end, a second end and an axial cavity (22) configured for fittingly accommodating a connecting pin (31), wherein a first flange (23) projects transversely from the holed body (21) at the first end, a second flange (24) projects transversely from the holed body (21) at the second end, the first flange (23) has a larger area than the second flange (24) and is configured to be ultrasonically soldered to a conductive bearing plate (25).

The holed body (21) may be tubular, for example cylindrical.

The holed body (21) may have a height comprised between 3 and 7 mm, the first flange (23) may have an outer diameter comprised between 2.5 and 4 mm, in particular of 3-3.5 mm; and the second flange (24) may have an outer diameter comprised between 1.25 and 2.5 mm, in particular of 1.5-1.75 mm.

A connection mounted plate of electronic, micro-mechanical and/or micro-electro-mechanical components, in particular belonging to a propulsion control circuit of an electric vehicle, may be summarized as including a bearing plate (25) having at least one first and one second conductive region (25A) that are reciprocally insulated, the first conductive region bearing a semiconductor die (30) and the second conductive region bearing a pin blocking element (20) according to any of the preceding claims, wherein the pin blocking element (20) and the semiconductor die (30) are soldered to the bearing plate (25) without interposed material.

The bearing plate (25) may be a DBC support comprising a first and a second conductive layer (25A), (25B) and an intermediate insulating layer (25C).

The connection mounted plate may further include at least one connecting pin (31) fitted into the pin blocking element (20), the connecting pin (31) having a first end (10A) fitted in the axial cavity (22) of the pin blocking element (20) and a deformable second end (10B) provided with a keyhole.

A power module, in particular for controlling the propulsion of an electric vehicle, may be summarized as including a housing (33) having a bottom wall (33B) and a side wall (33A) defining a chamber, wherein the side wall (33A) has a coupling edge for coupling with the connection mounted plate (25) according to any of claims 4-6 and the bottom wall (33B) has at least one through hole (38) traversed by the connecting pin (31), the power module (50) further comprising a connection support (41) attached to the housing (33) and facing the bottom wall (33B), the connection support (41) having at least one through opening (40) coupled through press-fit to the second end of the connecting pin (20).

The connection support (41) may be a printed circuit.

An assembling method may be summarized as including:
providing a bearing plate (25) having at least one first and one second conductive region (25A) that re reciprocally insulated;
soldering a semiconductor die (30) to the first conductive region (25A) of the bearing plate (25);
soldering a pin blocking element (20) to the second conductive region (25A), wherein the pin blocking element (20) has a holed body (21) provided with a first flange (23) at a first end, a second flange (24) at a second end and the first flange (23) has a larger area than the second flange (24);
wherein soldering a pin blocking element (20) comprises placing the pin blocking element with the first flange (23) in contact with the second conductive region (25A) and ultrasonically soldering using an HPUS technique.

The bearing plate (25) may be a DBC support.

The assembling method may further include fixing one end of a rod-shaped connecting pin (31) to the holed body (21) through interference fit.

The holed body (21) may have a height comprised between 3 and 7 mm, the first flange (23) may have an outer diameter comprised between 2.5 and 4 mm, in particular of 3-3.5 mm; and the second flange (24) may have an outer diameter comprised between 1.25 and 2.5 mm, in particular of 1.5-1.75 mm.

The ultrasonically soldering may include:
sucking the pin blocking element (20) in a gripping cavity (62) of a transducer (60) so that the second flange (24) and the holed body (21) enter the gripping cavity (62);
placing the second flange (24) of the pin blocking element (20) on the second conductive region (25A) of the bearing plate (25); and
generating ultrasound.

The generating ultrasound may include applying a power lower than 1 kW, a force comprised between 10 and 200 N for 0.1-1 seconds at room temperature.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a pin blocking element that includes:
a holed body having a first end, a second end and an axial cavity configured for fittingly accommodating a connecting pin;
a first flange projecting transversely from the holed body at the first end; and
a second flange projecting transversely from the holed body at the second end, the first flange having a larger area than the second flange, and
a conductive bearing plate, the first flange being welded directly to the conductive bearing plate without interposed material between the first flange and the conductive bearing plate.

2. The device according to claim 1, wherein the holed body is tubular.

3. The device according to claim 1, wherein the holed body has a height between 3 mm and 7 mm, the first flange has an outer diameter between 2.5 mm and 4 mm, and the second flange has an outer diameter between 1.25 and 2.5 mm.

4. A connection mounted plate, comprising:
a bearing plate having a first conductive layer and a second conductive layer that are separated by an insulating layer, the first conductive layer having a first portion, a second portion, a third portion, and a plurality of wires, the second portion bearing a semiconductor die and the first and third portions bearing a pin blocking element, the wires coupled between the first and third portions to the semiconductor die, the pin blocking element including:
a holed body having a first end, a second end and an axial cavity configured for fittingly accommodating a connecting pin;
a first flange projecting transversely from the holed body at the first end; and
a second flange projecting transversely from the holed body at the second end, the first flange having a larger area than the second flange,
wherein the first flange of the pin blocking element and the semiconductor die are in direct contact to the bearing plate without interposed material between the semiconductor die and the bearing plate.

5. The connection mounted plate according to claim 4, wherein the bearing plate is a Direct Bonded Copper (DBC) support including the first and the second conductive layer and the insulating layer.

6. The connection mounted plate according to claim 4, further comprising:
at least one connecting pin fitted into the pin blocking element, the connecting pin having a first end fitted in the axial cavity of the pin blocking element and a deformable second end provided with a keyhole.

7. The connection mounted plate according to claim 4, wherein the holed body is tubular.

8. The connection mounted plate according to claim 4, wherein the holed body has a height between 3 mm and 7 mm, the first flange has an outer diameter between 2.5 mm and 4 mm, and the second flange has an outer diameter between 1.25 and 2.5 mm.

9. A power module, comprising:
a connection mounted plate, including:
a bearing plate having at least one first and one second conductive layer, the first and second conductive layers separated by an insulating layer, the insulating layer having a width larger than the first and second conductive layers, the first conductive layer bearing a semiconductor die and a pin blocking element, the pin blocking element including:
a holed body having a first end, a second end and an axial cavity configured for fittingly accommodating a connecting pin;
a first flange projecting transversely from the holed body at the first end; and
a second flange projecting transversely from the holed body at the second end, the first flange having a larger area than the second flange;
a housing having a bottom wall and a side wall defining a chamber, wherein the side wall has a coupling edge for coupling with the connection mounted plate and the bottom wall has at least one through hole traversed by the connecting pin; and a connection support attached to the housing and facing the bottom wall, the connection support having at least one through opening coupled through press-fit to the second end of the connecting pin, wherein the first flange of the pin blocking element and the semiconductor die are in direct contact to the bearing plate without interposed material between the first flange of the pin blocking element and the bearing plate and without interposed material between the semiconductor die and the bearing plate.

10. The power module according to claim 9, wherein the connection support is a printed circuit.

11. The power module according to claim 9, wherein the holed body is tubular.

12. The power module according to claim 9, wherein the holed body has a height between 3 mm and 7 mm, the first flange has an outer diameter between 2.5 mm and 4 mm, and the second flange has an outer diameter between 1.25 and 2.5 mm.

13. A device, comprising:

a bearing plate;

a semiconductor die coupled to a first conductive region of the bearing plate, the bearing plate having the first conductive region and a second conductive region that are reciprocally insulated; and a pin blocking element coupled to the second conductive region, the pin blocking element has a holed body having a first flange at a first end, a second flange at a second end and the first flange has a larger area than the second flange, the first flange of the pin blocking element is directly and physically coupled to the second conductive region of the bearing plate between the first flange and the bearing plate, a plurality of wires coupled from the semiconductor die directly to the second conductive region of the pin blocking element.

14. The device of claim 13, wherein the bearing plate is a Directed Bonded Copper (DBC) support.

15. The device of claim 13, comprising one end of a rod-shaped connecting pin coupled to the holed body through interference fit.

16. The device of claim 13, wherein the holed body has a height between 3 mm and 7 mm, the first flange has an outer diameter between 2.5 mm and 4 mm, and the second flange has an outer diameter between 1.25 mm and 2.5 mm.

17. The device of claim 16, wherein the outer diameter of the first flange is between 3 mm and 3.5 mm, and the outer diameter of the second flange is between 1.5 mm and 1.75 mm.

18. The device of claim 13, wherein the semiconductor die is directly and physically coupled to the first conductive region of the bearing plate without interposed material between the semiconductor die and the first conductive region.

\* \* \* \* \*